United States Patent
Wallash et al.

(10) Patent No.: US 10,244,618 B2
(45) Date of Patent: Mar. 26, 2019

(54) PATTERNED GROUND STRUCTURE FILTER DESIGNS WITH IMPROVED PERFORMANCE

(71) Applicant: Western Digital Technologies, Inc., San Jose, CA (US)

(72) Inventors: Albert Wallash, Morgan Hill, CA (US); John Contreras, Palo Alto, CA (US); Satoshi Nakamura, Kanagawa (JP); Hui He, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/631,336

(22) Filed: Jun. 23, 2017

(65) Prior Publication Data
US 2017/0295644 A1     Oct. 12, 2017

Related U.S. Application Data

(63) Continuation-in-part of application No. 14/927,405, filed on Oct. 29, 2015, now Pat. No. 9,717,140.

(51) Int. Cl.
*H05K 1/02* (2006.01)
*H01P 7/06* (2006.01)
(Continued)

(52) U.S. Cl.
CPC ......... *H05K 1/0218* (2013.01); *G11B 25/043* (2013.01); *G11B 33/1493* (2013.01);
(Continued)

(58) Field of Classification Search
None
See application file for complete search history.

(56) References Cited

U.S. PATENT DOCUMENTS 6,088,235 A      7/2000   Chiao et al.
6,313,719 B1 *  11/2001   Barnett et al. ...... H01P 1/20372
                                                         333/202
(Continued)

FOREIGN PATENT DOCUMENTS

CN     106255307 A     12/2016
WO    2014045792 A1     3/2014

OTHER PUBLICATIONS

Liu, Qian et al., "Common-Mode Filters With Interdigital Fingers for Harmonics Suppression and Lossy Materials for Broadband Suppression," IEEE Transactions on Electromagnetic Compatibility, vol. 57, Issue 6, Oct. 2, 2015.
(Continued)

*Primary Examiner* — Craig A. Renner

(57) ABSTRACT

Disclosed herein are printed circuit boards (PCBs) with patterned ground structure filters and data storage devices comprising such PCBs. Each PCB comprises a resonator having an L-shape or a zig-zag shape in a plane of the printed circuit board and at least one signal trace. The resonator has a first dimension and a second dimension in the plane of the printed circuit board. A portion of the at least one signal trace is situated over the resonator and is separated by a distance from the resonator by a dielectric material. In some embodiments, at least part of the portion of the at least one signal trace extends in a same direction as the first dimension (in the case of an L-shaped resonator) or tracks the zig-zag shape of the resonator (in the case of a zig-zag-shaped resonator).

13 Claims, 11 Drawing Sheets

(51) Int. Cl.
 G11B 33/14 (2006.01)
 H05K 1/11 (2006.01)
 H05K 1/03 (2006.01)
 G11B 25/04 (2006.01)
 H01P 1/201 (2006.01)
 H01P 1/203 (2006.01)
 H01P 3/02 (2006.01)
 G11B 33/12 (2006.01)

(52) U.S. Cl.
 CPC ............ *H01P 1/203* (2013.01); *H01P 1/2013* (2013.01); *H01P 3/026* (2013.01); *H01P 7/065* (2013.01); *H05K 1/0225* (2013.01); *H05K 1/0245* (2013.01); *H05K 1/032* (2013.01); *H05K 1/0306* (2013.01); *H05K 1/115* (2013.01); *G11B 33/122* (2013.01); *H05K 1/0224* (2013.01)

(56) References Cited

U.S. PATENT DOCUMENTS

| | | | |
|---|---|---|---|
| 6,956,444 B2 | 10/2005 | Miller | |
| 7,330,325 B2 | 2/2008 | Vacar et al. | |
| 7,656,601 B1 | 2/2010 | Li | |
| 7,932,793 B2 | 4/2011 | Wu et al. | |
| 8,125,727 B2 | 2/2012 | Tsuwako et al. | |
| 8,126,402 B1 | 2/2012 | Jatou et al. | |
| 8,339,212 B2 | 12/2012 | Wu et al. | |
| 8,659,365 B2 | 2/2014 | Wu et al. | |
| 8,907,748 B2 | 12/2014 | Pajovic | |
| 9,059,491 B2 | 6/2015 | Lim et al. | |
| 2003/0021097 A1* | 1/2003 | Kikuchi et al. ...... | H05K 1/0218 361/818 |
| 2006/0181370 A1* | 8/2006 | Lee et al. ............ | H01P 1/20345 333/204 |
| 2010/0073109 A1 | 3/2010 | Wu et al. | |
| 2010/0321135 A1 | 12/2010 | Kushta | |
| 2011/0210897 A1* | 9/2011 | Byun et al. ............ | H01Q 1/243 343/749 |
| 2011/0273245 A1 | 11/2011 | Pai et al. | |
| 2014/0049343 A1 | 2/2014 | Sakai | |
| 2014/0133117 A1* | 5/2014 | Saji et al. ............ | H05K 1/0243 361/761 |
| 2016/0087323 A1 | 3/2016 | Wu et al. | |
| 2016/0142031 A1 | 5/2016 | Ueki et al. | |
| 2017/0127509 A1 | 5/2017 | Contreras et al. | |

OTHER PUBLICATIONS

Panasonic, "Common mode Noise Filter Array Type: EXC28CG," Nov. 2, 2012.

Tektronix, "Measurement Solutions for Disk Drive Design," Sep. 2006.

Fangxu Yang, et al., "An Ultra-Wideband Common-Mode Noise Filter for Differential Signals Using Compact Patterned Ground Structure," IEEE MTT-S International Microwave Symposium (IMS), May 2016.

Hailing Yue, et al., "Modified Spiral Shaped Defected Ground Structure with Spurious Free Band Rejection Performance," 2016 IEEE 17th Annual Wireless and Microwave Technology Conference (WAMICON), Apr. 2016.

Shu-Jung Wu, et al., "A Novel HU-shaped Common-mode Filter for GHz Differential Signals," IEEE International Symposium on Electromagnetic Compatibility, Aug. 2008.

Shu-Jung Wu, et al., "A Novel Wideband Common-Mode Suppression Filter for Gigahertz Differential Signals Using Coupled Patterned Ground Structure," IEEE Transactions on Microwave Theory and Techniques, vol. 57, No. 4, Apr. 2009.

Xian-Ke Gao, et al., "A Compact Common-mode Noise Suppression Filter for High Speed Differential Signals Using Defected Ground Stucture," 2015 Asia-Pacific Symposium on Elecromagnetic Compatibility (APEMC), May 2015.

Search Report and Written Opinion in PCT Application No. PCT/US2018/022813 (filed Mar. 16, 2018), dated Jun. 27, 2018.

* cited by examiner

PATTERNED GROUND STRUCTURE FILTER DESIGNS WITH IMPROVED PERFORMANCE

CROSS-REFERENCE TO RELATED APPLICATIONS

This application is a continuation-in-part of, and hereby incorporates by reference the contents of, U.S. application Ser. No. 14/927,405, filed Oct. 29, 2015 and entitled "SHIELDED PATTERNED GROUND STRUCTURE FILTER FOR EMI REDUCTION."

BACKGROUND

There are many ways to transmit signals over conductors. In single-ended signaling, one conductor carries a signal as a voltage that varies over time. The signal is referenced to a fixed potential, which is usually a 0 V node referred to as ground. Thus, one conductor carries the signal and one conductor carries the reference potential. The receiver extracts information by detecting the difference between the signal-carrying conductor and the reference potential.

In differential signaling, information is transmitted over two conductors using two complementary voltage signals, one over each conductor. One conductor carries the signal, and the other carries the inverted signal. The pair of conductors can be, for example, traces on a printed circuit board (PCB). The receiver extracts information from the pair of conductors by detecting the potential difference between the inverted and non-inverted signals. Ideally, the voltage signals on the two conductors have equal amplitude and opposite polarity relative to a common-mode voltage, in which case they are said to be "balanced." The return currents associated with these voltages also have equal amplitude and opposite polarity and thus cancel each other out; for this reason, differential signals ideally have zero current flowing through the ground connection.

Relative to single-ended signaling, differential signaling offers a number of advantages for high-speed data transfer. For example, if electromagnetic interference (EMI) or crosstalk (i.e., EMI generated by nearby signals) is introduced from a source outside the differential conductors, it is added equally to the inverted and non-inverted signal. Because the receiver operates on the difference in voltage between the two signals, the receiver circuitry will greatly reduce the amplitude of any interference or crosstalk is present in the received signal. Thus, differential signals are less sensitive than single-ended signals to EMI, crosstalk, or any other interference signals that couple into both signals of the differential pair.

Another advantage of differential signaling is that because differential signals have higher immunity to interference signals than single-ended signals, differential signals can use lower voltages than single-ended signals and still maintain adequate signal-to-noise ratio (SNR). In addition, the SNR with differential signaling is two times that of an equivalent single-ended implementation because the dynamic range at the differential receiver is twice as high as the dynamic range of each signal within the differential pair. Several advantages flow from the ability of differential signaling to successfully transfer data using lower signal voltages, including that supply voltage requirements are lower, which reduces power consumption. In addition, smaller voltage transitions, which are possible because of greater immunity to interference signals, allow for higher operating frequencies. Consequently, high-speed digital systems often use differential signaling.

Differential signaling also tends to cause less EMI than single-ended signaling. The rising and falling edges of digital signals can generate significant amounts of EMI, and both single-ended and differential signals generate EMI. But because the currents in the conductors in differential signaling travel in opposite directions, the two signals in a differential pair create electromagnetic fields that are opposite in polarity. If the differential signal paths are identical and in close proximity to each other, the individual electromagnetic fields caused by the two signals will largely cancel each other. If, however, the two signal paths are not identical, the generated magnetic fields will not be exactly equal and opposite and will not completely cancel each other. As a result, the common mode current on the two conductors is able to generate an electromagnetic field outside the pair of conductors, which act like an antenna and radiate EMI. In addition, due to integrated circuit process imperfections, mismatches in the different pair circuit drivers can produce an inherent common-mode signal, which can create EMI.

Although differential signal paths are ideally identical, and the signals carried on the two conductors ideally have equal amplitude and opposite polarity, practical systems using differential signaling typically suffer from common-mode interference signals caused by sources outside the differential conductors, and the differential conductors can also radiate EMI. These issues can be caused by clock skew, differences in amplitude between the signals on the two paths, unbalanced routing (e.g., one of the two paths is longer or shorter than the others, or the distance between conductors varies along their lengths, etc.), and other factors. Above the gigahertz frequency range, common-mode interference signals can degrade differential signal integrity and/or power integrity, and the use of differential signaling may also cause EMI radiation.

To mitigate common-mode interference signals and EMI radiation, a common-mode filter can be mounted on the surface of a PCB through which the differential signal traces are routed. Because a single surface-mounted filter may not provide sufficient attenuation of the common-mode interference signals, it may be necessary to mount multiple common-mode filters in series on the surface of the PCB to attenuate the common-mode interference signals adequately. The need for multiple filters increases the cost of the populated PCB and also either increases the size of the PCB or reduces the amount of PCB space available for other components.

Therefore, there is an ongoing need for alternative ways to reduce common-mode interference signals and mitigate EMI radiation.

SUMMARY

Disclosed herein are patterned ground structure (PGS) filter designs offering improved performance in suppressing common-mode interference signals. The PGS filters are built into the electrical system's PCB to attenuate EMI radiation. The disclosed PGS filters provide higher interference signal rejection (deeper notches) than surface-mounted filters and do not consume valuable surface area on the PCB. Moreover, the PGS filters can be shielded, and they may be used with both single-ended and differential signaling.

A PCB with a PGS filter as described herein may be included in a storage device, such as, for example, a hard disk drive.

In some embodiments, a printed circuit board comprises a resonator and a signal trace, which may be a differential signal trace or a single-ended signal trace. The resonator has an L-shape with a first dimension and a second dimension in a plane of the printed circuit board, where, in some embodiments, the first dimension is longer than the second dimension. A portion of the signal trace is situated over the resonator and separated by a distance from the resonator by a dielectric material. At least part of the portion (i.e., all or less than all) of the signal trace extends in the same direction as the first dimension. In some embodiments, a second part of the portion of the signal trace situated over the resonator extends in the same direction as the second dimension.

In some embodiments, the distance by which the portion of the signal trace is separated from the resonator is between approximately μm and 100 μm. In some embodiments, the first dimension is between approximately 4 mm and 9 mm. In some embodiments, the second dimension is between approximately 100 microns and 3 mm. In some embodiments, the length of the portion of the signal trace situated over the resonator is between approximately 4 mm and 9 mm.

In some embodiments, the PCB comprises a second resonator that is identical to the first resonator and positioned directly above or below the first resonator such that the orientation of the second resonator is identical to the orientation of the first resonator. A via connects the first resonator to the second resonator, and the portion of the signal trace is situated between the first and second resonators.

In some embodiments, a PCB comprises a signal trace (e.g., a differential signal trace or a single-ended signal trace) and a resonator having a zig-zag shape in a plane of the printed circuit board, the resonator having a first dimension and a second dimension in the plane of the printed circuit board. In some such embodiments, a portion of the signal trace is situated over the resonator, the portion of the signal trace is separated by a distance from the resonator by a dielectric material, and at least part of the portion of the signal trace tracks the zig-zag shape of the resonator. In some embodiments, the length of the portion of the signal trace situated over the resonator is between approximately 4 mm and 9 mm.

In some embodiments in which the resonator has a zig-zag shape, the PCB comprises a second resonator that is identical to the first resonator and positioned directly above or below the first resonator such that the orientation of the second resonator is identical to the orientation of the first resonator. A via connects the first resonator to the second resonator, and the portion of the signal trace is situated between the first and second resonators.

BRIEF DESCRIPTION OF THE DRAWINGS

Objects, features, and advantages of the disclosure will be readily apparent from the following description of certain embodiments taken in conjunction with the accompanying drawings in which.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

In the following, reference is made to embodiments of the disclosure. It should be understood, however, that the disclosure is not limited to specific described embodiments. Instead, any combination of the following features and elements, whether related to different embodiments or not, is contemplated to implement and practice the disclosure. Furthermore, although embodiments of the disclosure may achieve advantages over other possible solutions and/or over the prior art, whether or not a particular advantage is achieved by a given embodiment is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Figure 1:
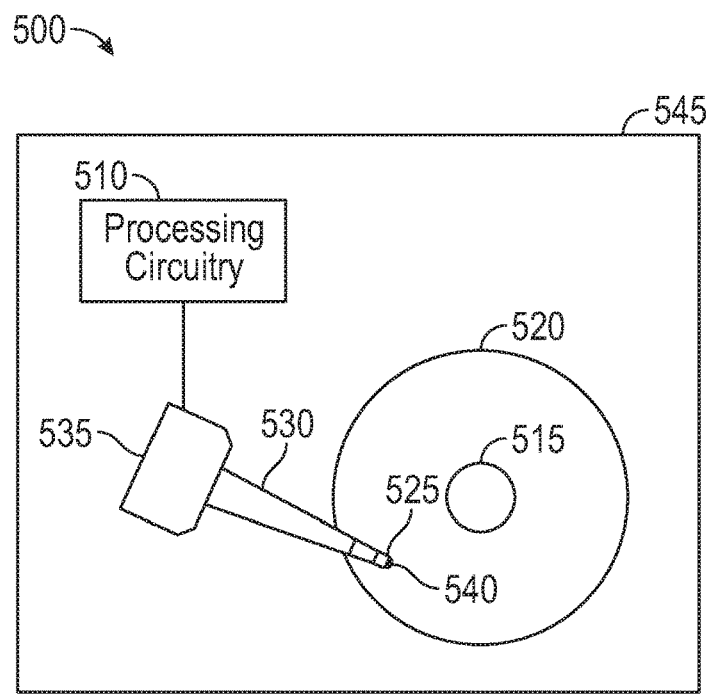
FIG. 1 illustrates several components of an exemplary hard disk drive in accordance with some embodiments.

FIG. 1 illustrates several components of an exemplary hard disk drive 500 that may include some embodiments. The magnetic hard disk drive 500 includes a spindle 515 that supports and rotates a magnetic disk 520. The spindle 515 is rotated by a spindle motor (not shown) that is controlled by a motor controller (not shown) that may be implemented in electronics of the hard disk drive 500. A slider 525, which is supported by a suspension and actuator arm 530, includes a combined read and write magnetic head 540. An actuator 535 rotatably positions the suspension and actuator arm 530 over the magnetic disk 520. The components of the hard disk drive 500 may be mounted on a housing 545. It is to be understood that although FIG. 1 illustrates a single disk 520, a single slider 525, a single head 540, and a single suspension and actuator arm 530, hard disk drive 500 may include a plurality (i.e., more than one) of disks 520, sliders 525, heads 540, and suspension and actuator arms 530.

The slider 525 has a gas-bearing surface that faces the surface of the disk 520 and counteracts a preload bias that pushes the slider toward the disk 520. For convenience, in this document the gas-bearing surface is referred to as the air-bearing surface (ABS) and the gas is generally referred to as "air," although it is to be understood that the gas used in a hard disk drive 500 may be a gas other than air (e.g., the gas may be helium). For simplicity, throughout this disclosure, the surface of the slider 525 that faces or that will eventually face the disk 520 is referred to as the ABS.

As the disk 520 rotates, the disk 520 drags air under the slider 525 and along the ABS in a direction approximately parallel to the tangential velocity of the disk 520. As the air passes under the ABS, air compression along the air flow path causes the air pressure between the disk 520 and the ABS to increase, which creates a hydrodynamic lifting force that counteracts the tendency of the suspension and actuator arm 530 to push the slider 525 toward the disk 520. The slider 525 thus flies above the disk 520 but in close proximity to the surface of the disk 520.

In operation, the actuator 535 moves the suspension and actuator arm 530 to position the slider 525 so that the magnetic head 540 is in a transducing relationship with the surface of the magnetic disk 520. The head 540 may be used to write information to one or more tracks on the surface of the disk 520 and to read previously-recorded information from the tracks on the surface of the disk 520. Processing circuitry 510 provides to the head 540 signals representing information to be written to the disk 520 and receives from the head 540 signals representing information read from the disk 520. The processing circuitry 510 also provides signals to the spindle motor to rotate the magnetic disk 520, and to the actuator 535 to move the slider 525 to various tracks.

For writing, the head 540 may use a single pole writer that has a main pole surrounded by magnetic shield materials. The main pole is typically separated from the magnetic shield materials by a non-magnetic spacer. The main pole may have a tapered shape with a tip that faces the magnetic recording media and is part of the ABS. The single pole writer may include a conductive coil encircling the writer pole in a helical or pancake like configuration.

To write to the disk 520, the slider 525 passes over a region of the disk 520, and an electric current is applied through the coil of the head 540, which causes a large magnetic field to be generated from the main pole tip. The polarity of the generated field causes a region of the magnetic disk 520 to assume a polarity, thus enabling information to be stored on the disk 520.

To read information from the disk 520, the head 540 may include only one read sensor, or it may include multiple read sensors. The read sensor(s) in the head 540 may include, for example, one or more giant magnetoresistance (GMR) sensors, tunneling magnetoresistance (TMR) sensors, or another type of magnetoresistive sensor. When the slider 525 passes over a region of the disk 520, the head 540 detects changes in resistance due to magnetic field variations recorded on the disk 520, which represent the recorded bits.

Figure 2:
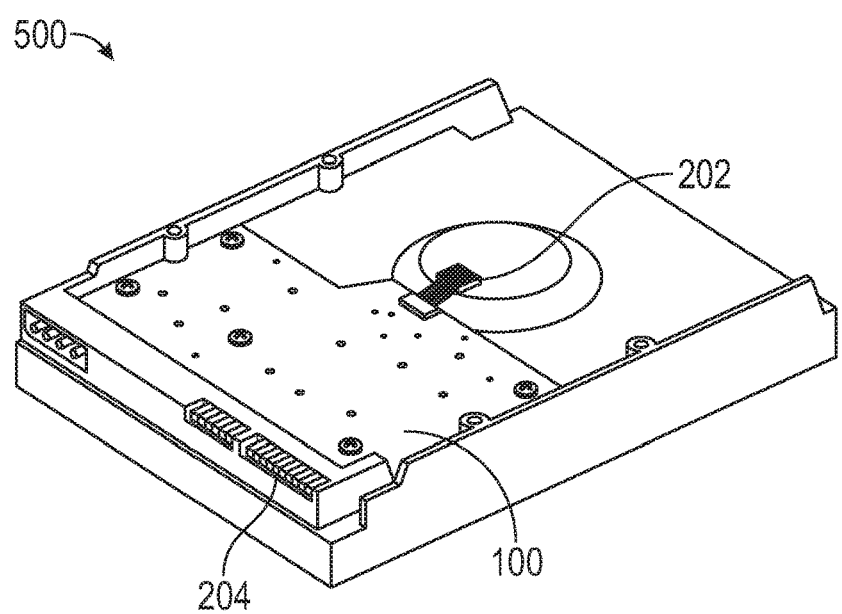
FIG. 2 is a schematic bottom illustration of a hard disk drive that includes a printed circuit board.

FIG. 2 is a schematic bottom illustration of a hard disk drive 500 including a PCB 100. The PCB 100 has electrical connections 202 to other components of the hard disk drive 500 and electrical connections 204 to be used to connect the hard disk drive 500 to a device (e.g., a computer) that will use the hard disk drive 500.

Hard disk drives 500 utilize serial interface input/output electrical lines, and the serial attached small (SAS) computer-system interface, which may inherently generate common-mode interference signals at frequencies that are multiples of 6 GHz, i.e., 6 GHz, 12 GHz, 18 GHz, and 24 GHz at SAS trace. Practicable solutions to filter out such common-mode interference signals suffer from various deficiencies, such as not providing sufficient notch depths at the affected frequencies, or being too large and/or too numerous to fit on the surface of a PCB.

Figure 3A:
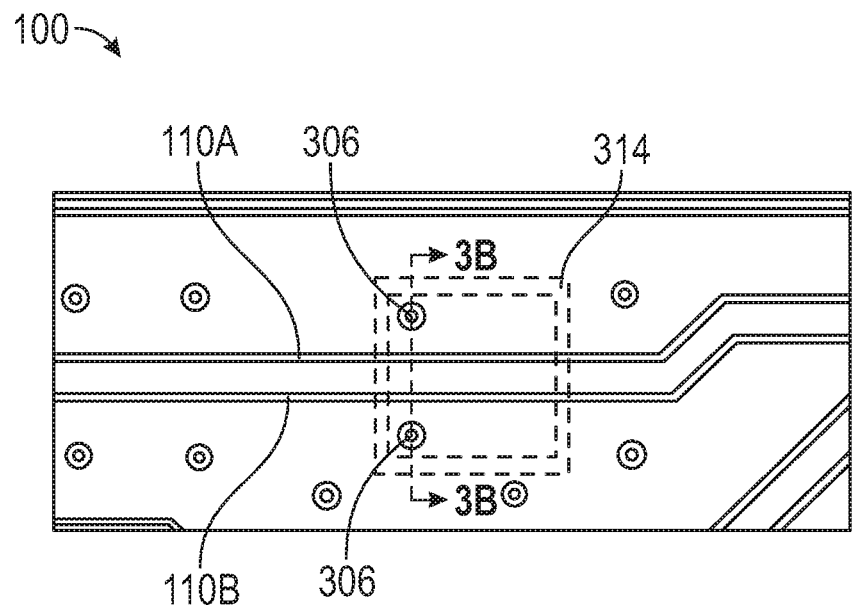
FIGS. 3A and 3B are schematic top and cross-sectional illustrations of a partially unshielded PGS in a PCB in accordance with some embodiments.
Figure 3B:
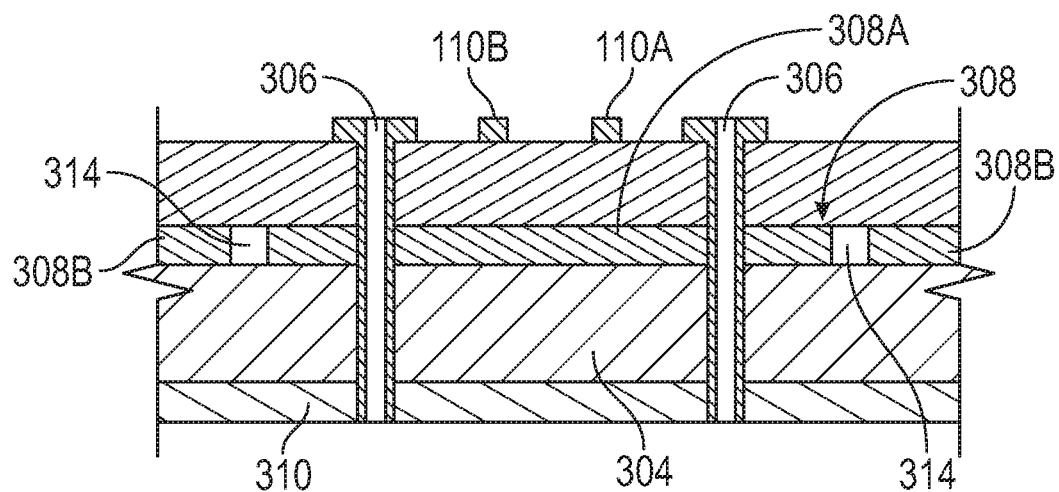

FIGS. 3A and 3B are schematic top and cross-sectional illustrations of a partially unshielded pattern ground structure in a PCB 100 that mitigates at least some of the problems of prior-art filter solutions. Two traces 110A, 110B for providing a differential-mode signal are shown. Because of practical constraints and imperfections, the traces 110A, 110B have a common-mode signal passing thereon during device operation. The common-mode signal is a cause of EMI detected in hard disk drives. A resonator cavity 304 (shown in FIG. 3B) can be used to reduce and even eliminate the common-mode signal on the traces 110A, 110B. The resonator cavity 304 includes a plurality of electrical anchor elements 306, which may be, for example, plated vias as shown in FIG. 3B. The anchor elements 306 connect to a ground plane. The resonator cavity 304 is bounded by a first shield layer 308 and a second shield layer 310. The first shield layer 308 has a first portion 308A and a second portion 308B spaced apart from the first portion 308A by a gap 314. The gap 314 is in the shape of a rectangle as shown in FIG. 3A, but it is to be understood that the gap 314 may have other shapes as well, such as described below. The gap 314 is filled with dielectric material and forms the side of a shielding box. The gap 314 is, in essence, stitched into the structure. In the embodiment shown in FIGS. 3A and 3B, the traces 110A, 110B are only shielded on the bottom, and thus there is only one resonator cavity 304 disposed below the traces 110A, 110B. As will be discussed below, a partially shielded PCB 100, as shown in FIGS. 3A and 3B, may help reduce the common-mode signal, but additional shielding may be beneficial. In the embodiment shown in FIGS. 3A and 3B, an unshielded PGS is shown. As will be shown below, the PGS of FIGS. 3A and 3B may be flipped over on itself to, in essence, create a mirror-image resonator cavity so that there is a resonator cavity on both sides of the traces 110A, 110B.

Figure 4A:
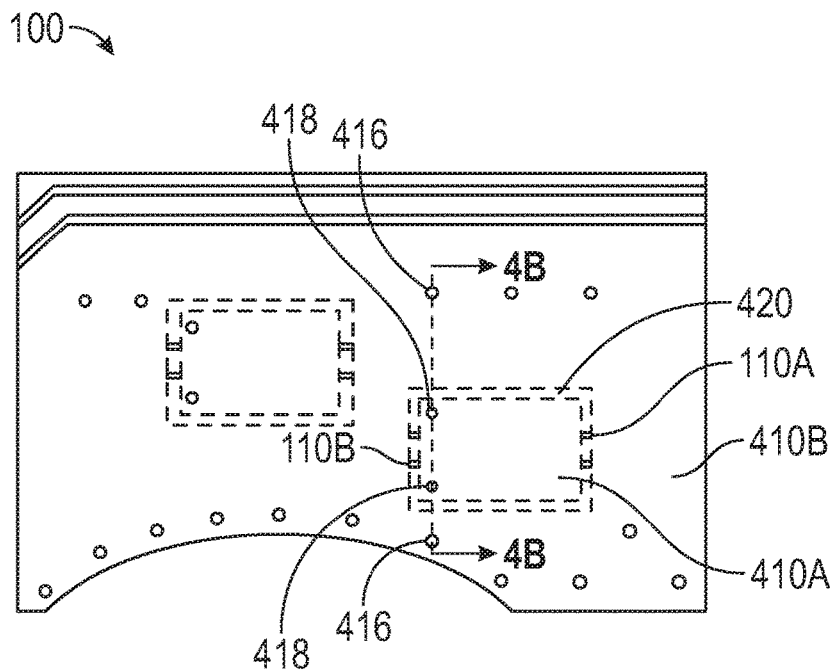
FIGS. 4A and 4B are schematic top and cross-sectional illustrations of a shielded PGS in a PCB in accordance with some embodiments.
Figure 4B:
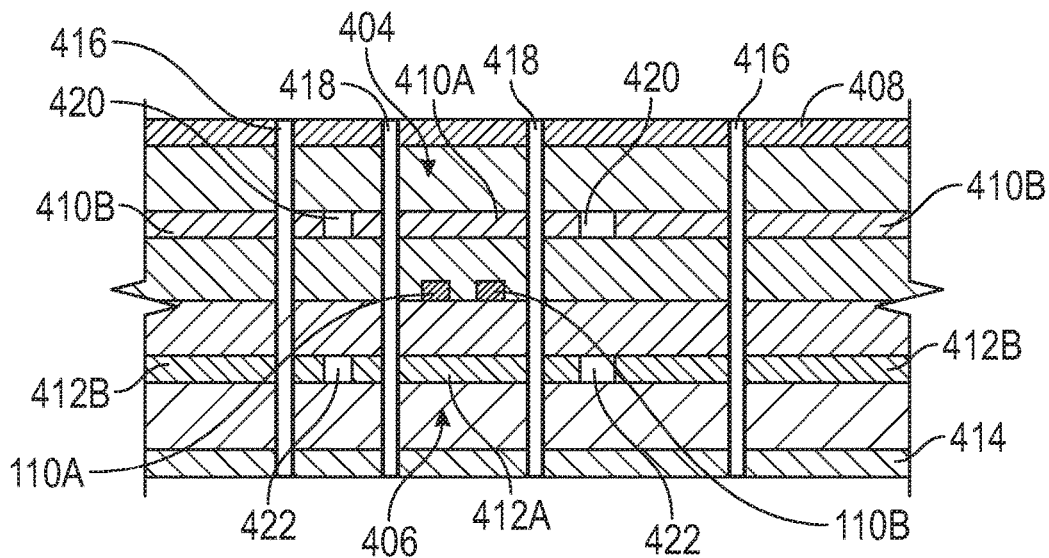

FIGS. 4A and 4B are schematic top and cross-sectional illustrations of a shielded PGS in a PCB 100 in accordance with some embodiments. In FIG. 4A, the first shield 408 has been removed for clarity. The traces 110A, 110B are shielded on both the top and the bottom by resonator cavities 404, 406. The structure includes a first shield 408; a second shield comprising a middle portion 410A and an outer portion 410B; and anchor elements 416 and 418. The middle portion 410A and the outer portion 410B are spaced apart by a gap 420. As discussed above, the gap 420 is filled with a dielectric material and is in the shape of a rectangle as shown in FIG. 4A, but it is to be understood that the gap 420 may have other shapes as well, as described blow. The gap 420 forms the side of a shielding box. The gap 420 is, in essence, stitched into the structure. The first shield 408, middle portion 410A, and anchor elements 418 collectively enclose the top resonator cavity 404. A third shield having a middle portion 412A and an outer portion 412B are also present, as is a fourth shield 414. The middle portion 412A, fourth shield 414, and anchor elements 418 collectively enclose the bottom resonator cavity 406. The middle portion 412A and outer portion 412B are spaced apart by a gap 422. As discussed above, the gap 422 is filled with a dielectric material and is in the shape of a rectangle (being identical to the gap 420 shown in FIG. 4A), but it is to be understood that the gap 422 may have other shapes as well. The gap 422 forms the side of a shielding box. The gap 422 is, in essence, stitched into the structure. The material surrounding the traces 110A, 110B is a dielectric.

The first shield 408, middle portion 410A, outer portion 410B, middle portion 412A, outer portion 412B, and fourth shield 414 may all comprise a conductive material such as, for example, copper, tantalum, titanium, tungsten, or alloys thereof. In some embodiments, the first shield 408, middle portion 410A, outer portion 410B, middle portion 412A, outer portion 412B, and fourth shield 414 all comprise the same material. In other embodiments, at least one of the first shield 408, middle portion 410A, outer portion 410B, middle portion 412A, outer portion 412B, and fourth shield 414 comprises a different material compared to the others. The gaps 420, 422 and the areas between the first shield 408, middle portion 410A, outer portion 410B, middle portion 412A, outer portion 412B, and fourth shield 414 may comprise an insulating material such as, for example, silicon oxide, silicon nitride, silicon oxynitride, glass-reinforced epoxy laminate material (FR-4), or other dielectric material.

The devices described above all coordinate the common-mode filter and frequency to impact the common-mode signal transfer. The PGS filters described have little to no impact on the differential signal transfer. The PGS filters work by having a length (defined as the length of the traces between the bounds of the gaps 314, 420, 422) that is one-fourth the common-mode signal wavelength. The PGS filters present, at the designed-for frequency, high impedance to the common-mode signal, thereby shunting the common-mode signal to ground, but low impedance to the differential signal.

In the embodiments shown in FIGS. 3A, 3B, 4A, and 4B, single patterned ground structures (PGS) are shown with either a single resonator cavity (in the partially-shielded embodiment) or two resonator cavities (in the shielded embodiment). As will be discussed below, additional structures may be present.

Figure 5A:
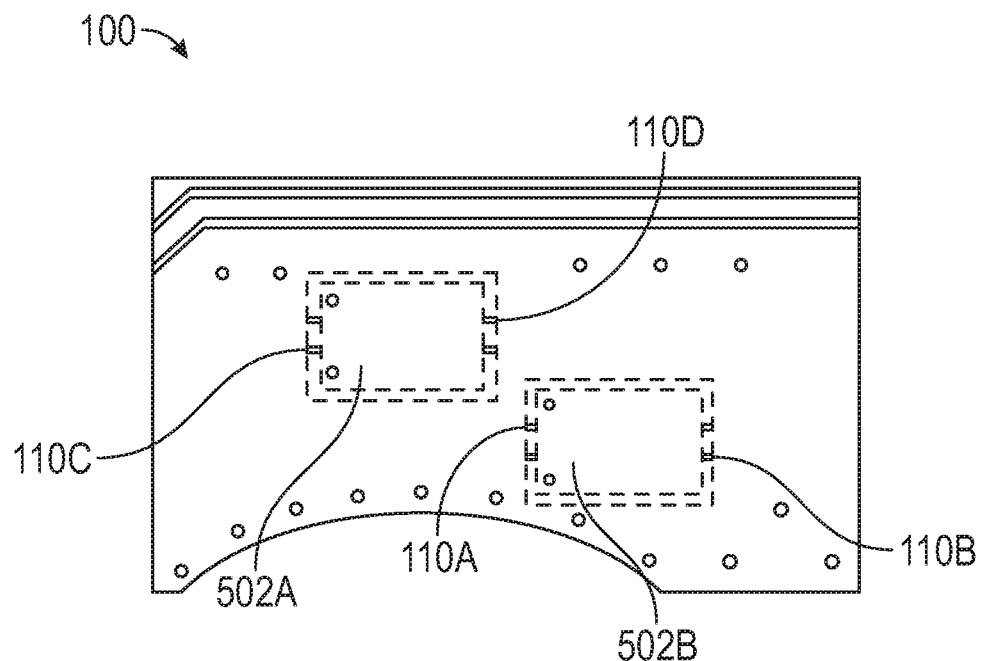
FIGS. 5A-5D are schematic illustrations of a PCB having multiple patterned ground structures in accordance with some embodiments.

FIGS. 5A-5D are schematic illustrations of a PCB 100 having multiple patterned ground structures according to various embodiments. As shown in FIG. 5A, multiple PGS 502A, 502B are shown such that each of PGS 502A, 502B has two differential signal traces passing therethrough. In the embodiment shown in FIG. 5A, the PGS 502A and PGS 502B are substantially identical. Thus, PGS 502A and PGS 502B of FIG. 5A reduce and/or remove the common-mode signal at substantially the same frequency.

Figure 5B:
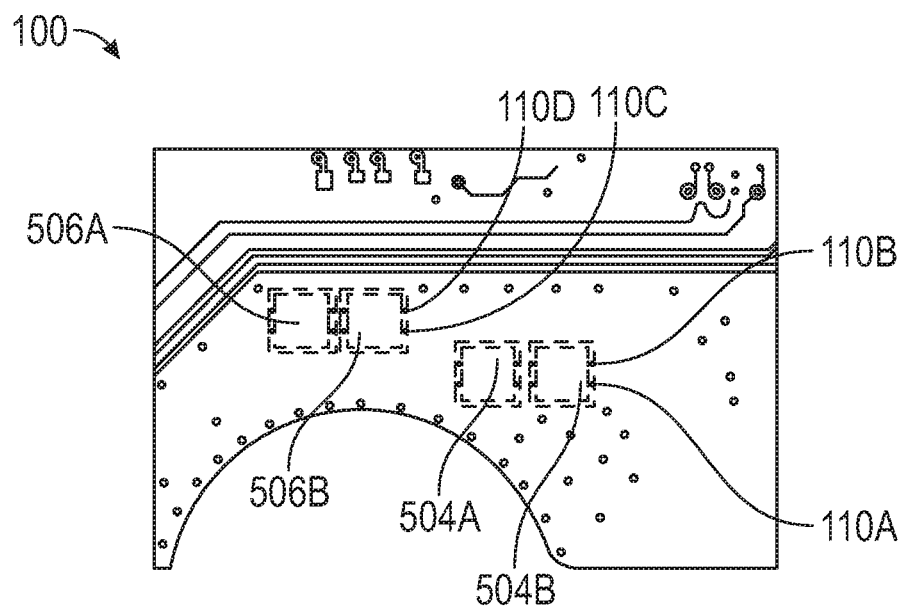

FIG. 5B shows two sets of patterned ground structures in which a first set has two PGS structures 504A, 504B, and a second set has two PGS structures 506A, 506B. Two differential signal traces pass through each set such that two differential signal traces 110A, 110B pass through both PGS structures 504A, 504B and two different differential signal traces 110C, 110D pass through PGS structures 506A, 506B. In the embodiment shown in FIG. 5B, each PGS structure 504A, 504B, 506A, 506B is shown to be substantially identical, but the structures need not be the same. FIG. 5B shows that rather than a single PGS, multiple PGS may be used in series to reduce and/or remove common-mode signals. As will be discussed below, the patterned ground structures need not be identical.

Figure 5C:
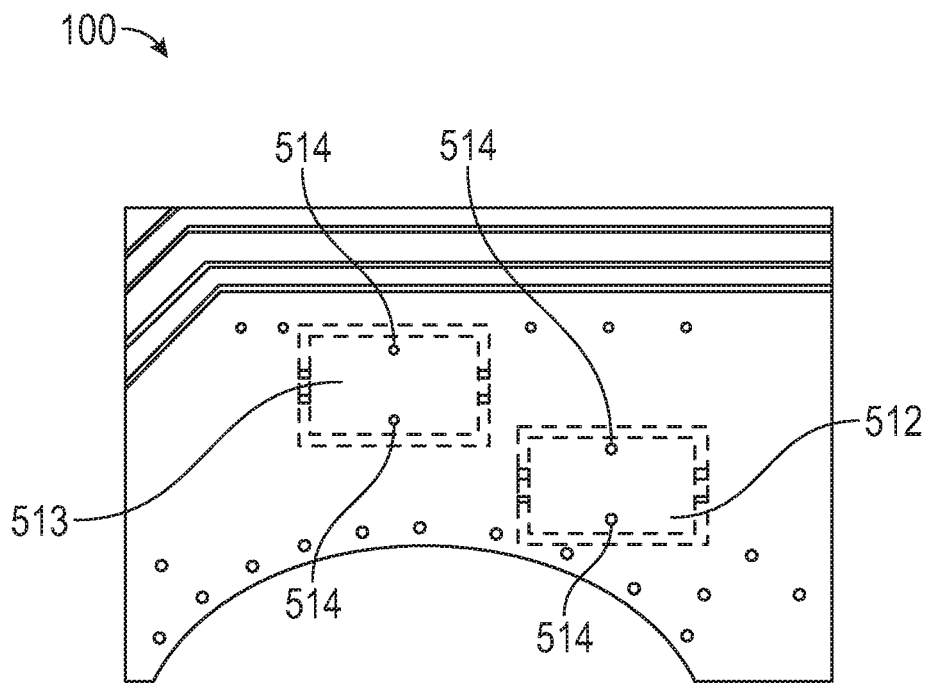

FIG. 5C shows two PGS 512, 513 each having anchor elements 514 that are spaced in a different location from that shown in FIGS. 5A and 5B. The location of the anchor elements 514 affects the common-mode frequency that may be reduced and/or removed. In the embodiment shown in FIG. 5C, the anchor elements 514 are disposed substantially in the center of the PGS, whereas the anchor elements 514 are disposed closer to one end of the PGS in FIGS. 5A and 5B.

Figure 5D:
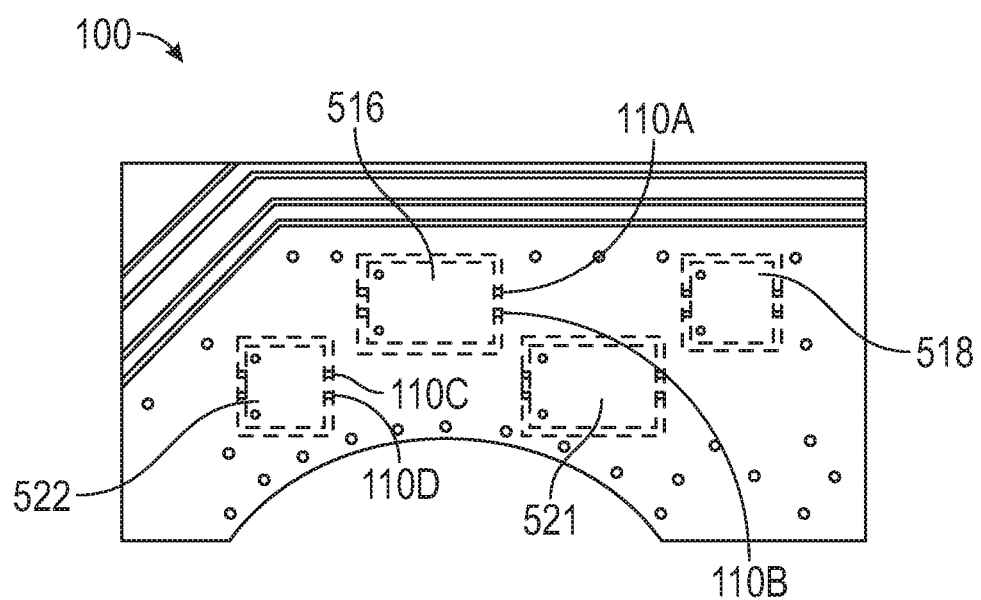

The size (i.e., length and width) of the PGS may also affect the common-mode frequency that is reduced and/or removed. FIG. 5D shows four different PGS structures 516, 518, 521, 522. The PGS structures 516, 518, 521, 522 have different lengths and widths. Four total differential signal traces pass through the PGS structures 516, 518, 521, 522 such that two traces 110A, 110B pass through PGS structures 516, 518 and two different traces 110C, 110D pass through PGS structures 521, 522. The different-sized PGS structures 516, 518 enable two different common-mode frequencies to be reduced and/or eliminated along the differential signal traces 110A, 110B that pass therethrough. Similarly, different-sized PGS structures 521, 522 allow two different common mode frequencies to be reduced and/or eliminated along the traces 110C, 110D that pass therethrough.

It is to be understood that, as described below, the PGS may have different shapes, such as "L" shaped, "T" shaped, or other shapes (i.e., the shape of any PGS may be non-rectangular). Furthermore, as described above, the PGS structures may arranged in series such that the same set of differential signal traces passes through multiple PGS structures, for example two or four structures. Additionally, the PGS structures arranged in series may have the same or different-shaped gaps 314, 420, 422.

Figure 6A:
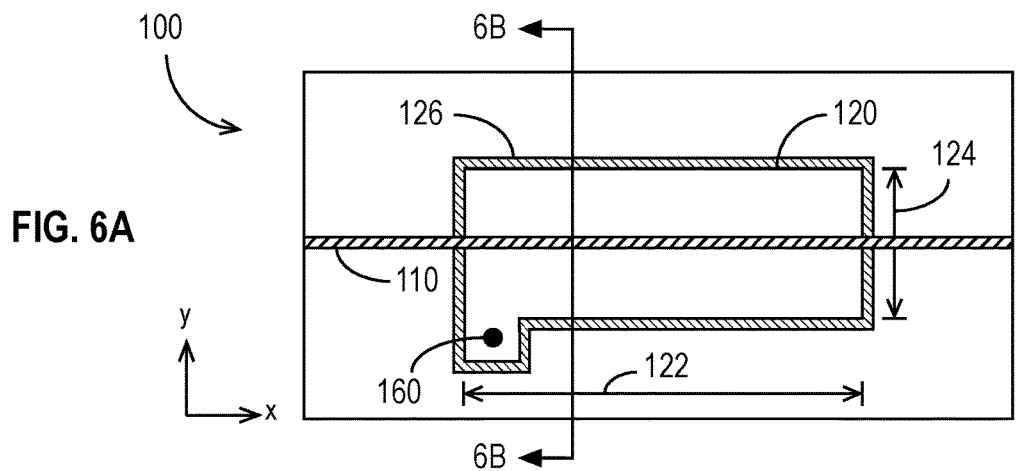
FIGS. 6A-6C illustrate a PCB with a PGS filter in accordance with some embodiments.

FIG. 6A illustrates a PCB 100 having an L-shaped PGS in accordance with some embodiments. The PCB 100 is shown from the top, with the surface of the PCB 100 arbitrarily designated to be in the x-y plane as indicated in FIG. 6A. The PCB 100 includes a resonator 120 that has an L-shape in the x-y plane of the PCB 100. The resonator 120 has a first dimension 122 and a second dimension 124 in the x-y plane of the PCB 100. The first dimension 122 and the second dimension 124 may be any suitable lengths that provide the desired filtering characteristics. In some embodiments, the first dimension 122 is longer than the second dimension 124. The first dimension 122 affects the frequency of the PGS. For example, to filter a frequency of 24 GHz, the first dimension 122 may be around 1 mm, whereas to filter a frequency of 6 GHz, the first dimension 122 should be significantly longer (e.g., around 6 mm). The second dimension 124 affects the depth and shape of the notch created by the PGS filter. The second dimension 124 should be at least as long as the width of the at least one signal trace 110 to filter the common-mode signals. Larger values of the second dimension 124 tend be preferable to mitigate the effects of fringe fields. To tune the PGS filter, a full three-dimensional simulation may be useful to account for effects such as the dielectric constant of the dielectric material 150 in the gap 126. For hard disk drive applications in which it is desirable for the PGS to filter frequencies above 1 GHz, suitable values for the first dimension 122 include, for example, lengths between approximately 4 mm and 9 mm. Suitable values for the second dimension 124 include, for example, lengths between approximately 100 microns and 3 mm.

The resonator 120 is surrounded by a gap 126. As explained above, the gap 126 is filled with dielectric material. At least one signal trace 110 is situated over the resonator 120. The at least one signal trace 110 may be a single-ended signal trace or a trace used for differential signaling. In the case of differential signaling, the at least one signal trace 110 includes two signal traces 110A, 110B, both of which are situated over the resonator 120. As illustrated in FIG. 6A, at least a portion of the at least one signal trace 110 extends in the same direction as the first dimension 122. In the embodiment of FIG. 6A, the entirety of the at least one signal trace 110 that is situated over the resonator 120 extends in the same direction as the first dimension 122. In other embodiments, discussed below, only a portion of the at least one signal trace 110 that is situated over the resonator 120 extends in the same direction as the first dimension 122. At least one via 160 (also referred to as an anchor element) extends through the resonator 120 in a direction perpendicular to the x-y plane. The at least one via 160 connects to the ground plane 170, shown in FIG. 6B. Although FIG. 6A shows only one via 160, the PCB may include multiple vias 160 in and around the resonator 120, as illustrated by the positions of the anchor elements in other figures discussed herein.

Figure 6B:
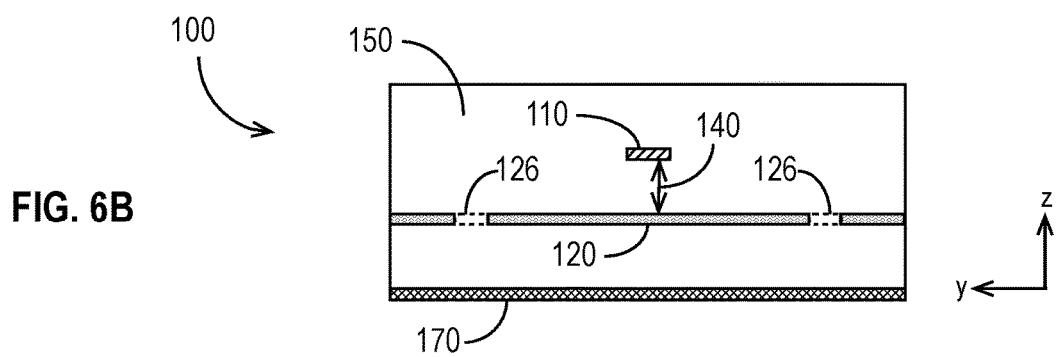

FIG. 6B shows a cross-section of the PCB 100 of FIG. 6A along the 6B-6B line shown in FIG. 6A. Thus, the cross-section is in the y-z plane. For clarity of the drawing, and in contrast to FIG. 6A, the dielectric material 150, including in the gap 126, is illustrated as unshaded in FIG. 6B, and the resonator 120 is shaded. As shown in FIG. 6B, the at least one signal trace 110 is spaced from the resonator 120 by a distance 140. The distance may be, for example, between approximately 30 µm and 100 µm. The at least one signal trace 110 is surrounded by, and separated from the resonator 120 by, a dielectric material 150. The dielectric material may be, for example, an insulating material such as silicon oxide, silicon nitride, silicon oxynitride, glass-reinforced epoxy laminate material (FR-4), or other dielectric material.

Figure 6C:
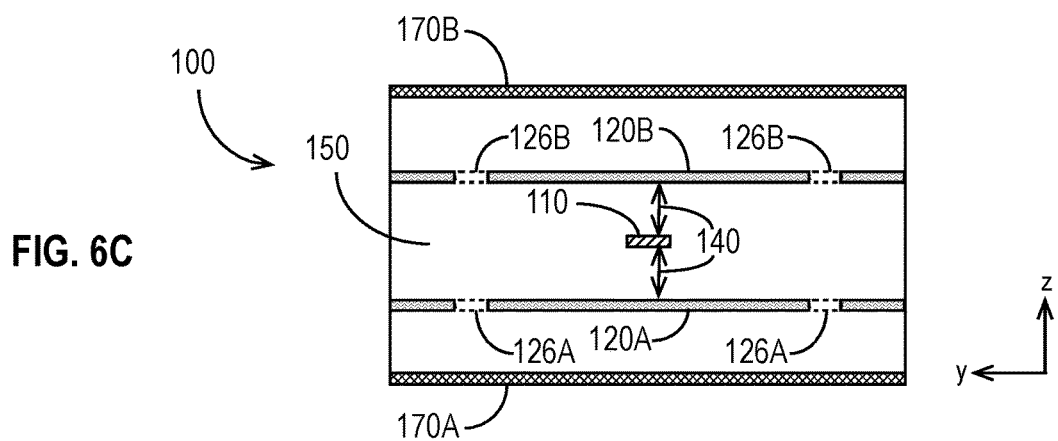

FIG. 6B illustrates an unshielded PGS filter. FIG. 6C illustrates that the PGS filter may be shielded in accordance with some embodiments by positioning a substantially identical structure, including the additional ground plane 170B, over the at least one signal trace 110. As shown in FIG. 6C, the PCB 100 includes a lower resonator 120A, bounded by a first gap 126A, and an upper resonator 120B, bounded by a second gap 126B. The upper resonator 120B and second gap 126B are substantially identical in size, shape, and materials to the lower resonator 120A and first gap 126A. In addition, the upper resonator 120B is approximately the same distance from the at least one signal trace 110 as the lower resonator 120A. Thus, the upper resonator 120B and second gap 126B, if viewed in the x-y plane, would look identical to the resonator 120 and gap 126 shown in FIG. 6A.

Figure 7A:
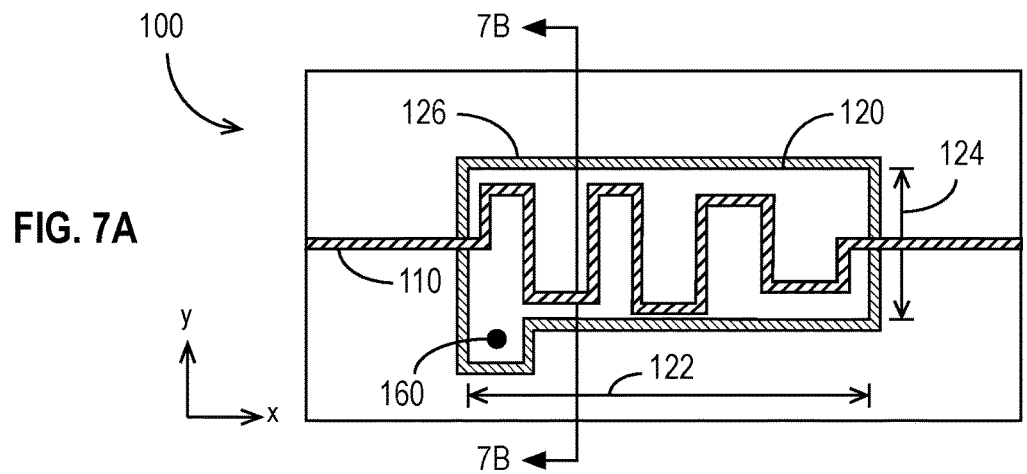
FIGS. 7A-7C illustrate a PCB with a PGS filter in accordance with some embodiments.

FIG. 6A shows at least one signal trace 110 that, for the length of the portion of the at least one signal trace 110 that is situated over the resonator 120, extends in the same direction as the first dimension 122 of the resonator 120. FIG. 7A illustrates that, in accordance with some embodiments, part of the portion of the at least one signal trace 110 that is situated over the resonator 120 (or between the lower resonator 120A and upper resonator 120B in shielded embodiments) may extend in other directions. For example, the at least one signal trace 110 may meander or "zig zag" over the resonator 120 as shown in FIG. 7A. This approach increases the length of the at least one signal trace 110 that is situated over the resonator 120, which, as explained below, increases the depths of the notches provided by the PGS filter. FIG. 7A illustrates just one of many possible paths the at least one signal trace 110 may take over the resonator 120. In general, the at least one signal trace 110 may traverse over the resonator 120 in any direction or combination of directions. A serpentine path similar to that shown in FIG. 7A may be used to maximize the length of the at least one signal trace 110 over the resonator 120.

Figure 7B:
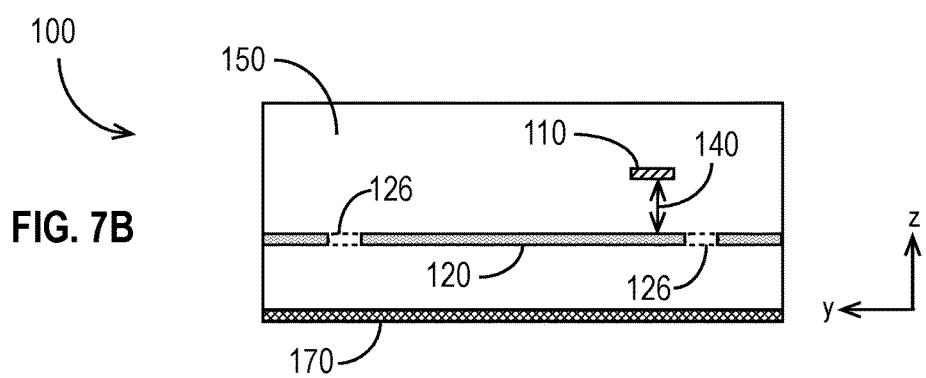
Figure 7C:
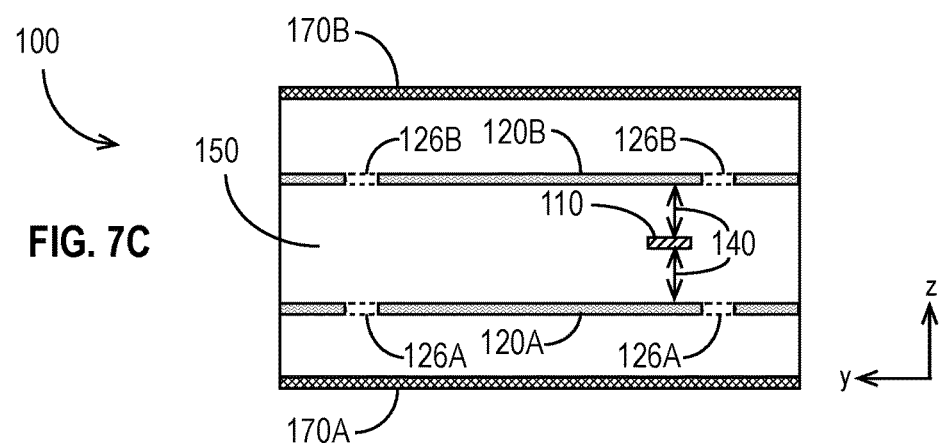

FIG. 7B illustrates a cross-section of the PCB 100 of FIG. 7A along the 7B-7B line shown in FIG. 7A. Thus, the cross-section is in the y-z plane. As shown in FIG. 7B, the meandering at least one signal trace 110 is spaced from the resonator 120 by a distance 140. The meandering at least one signal trace 110 is surrounded by, and separated from the resonator 120 by, a dielectric material 150, which may be an insulating material such as silicon oxide, silicon nitride, silicon oxynitride, glass-reinforced epoxy laminate material (FR-4), or other dielectric material. FIG. 7C illustrates that, as previously described, the unshielded PGS of FIG. 7B may be shielded in accordance with some embodiments by positioning a substantially identical structure over the at least one signal trace 110. As shown in FIG. 7C, the PCB 100 includes a lower resonator 120A, bounded by a first gap 126A, and an upper resonator 120B, bounded by a second gap 126B. The upper resonator 120B and second gap 126B are substantially identical in size, shape, and materials as the lower resonator 120A and first gap 126A. Thus, the upper resonator 120B and second gap 126B, if viewed in the x-y plane, would look identical to the resonator 120 and gap 126 shown in FIG. 7A.

Figure 8:
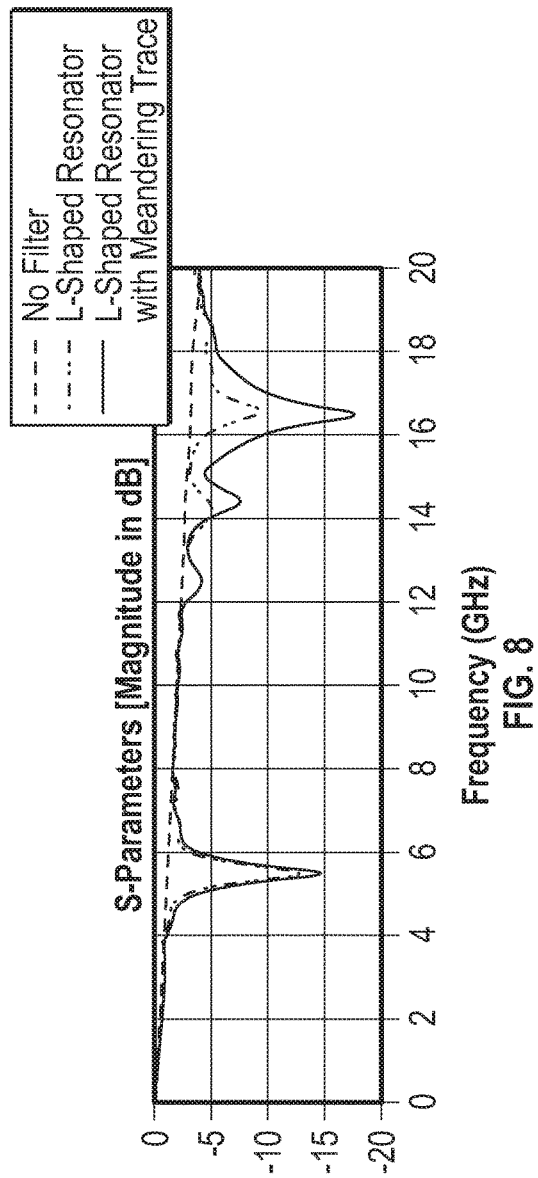
FIG. 8 illustrates how the S-parameters of the PGS filter shown in FIGS. 6A-6C differ from the S-parameters of the PGS filter shown in FIGS. 7A-7C.

FIG. 8 illustrates how the S-parameters of the PGS filter differ between (a) the shielded L-shaped resonator 120 with at least one signal trace 110 that extends in the same direction as the first dimension 122 of the resonator 120, as illustrated in FIGS. 6A and 6C, and (b) the shielded L-shaped resonator 120 with at least one signal trace 110 that meanders over the resonator 120 shown in FIGS. 7A and 7C. The first dimension 122 is approximately 6 mm, the second dimension 124 is approximately 2-3 mm, and the width of the gap 126 is approximately 100 microns. Also shown for comparison purposes is the magnitude of the common-mode signal without any filter (dashed line). As shown by the dash-dot line in FIG. 8, the L-shaped resonator 120 alone provides notches at approximately 5.5 GHz and 16.5 GHz. The notch at 5.5 GHz is approximately 12.5 dB, and the notch at 16.5 GHz is approximately 9 dB. The solid line of FIG. 8 illustrates that the combination of the L-shaped resonator 120 and the meandering at least one signal trace 110 shown in FIGS. 7A and 7C results in deeper notches, and thus better suppression of the common-mode signal, at both 5.5 GHz and 16.5 GHz. With both the L-shaped resonator 120 and the meandering at least one signal trace 110, the notch at 5.5 GHz is approximately 15 dB, and the notch at 16.5 GHz is approximately 17.5 dB.

Figure 9A:
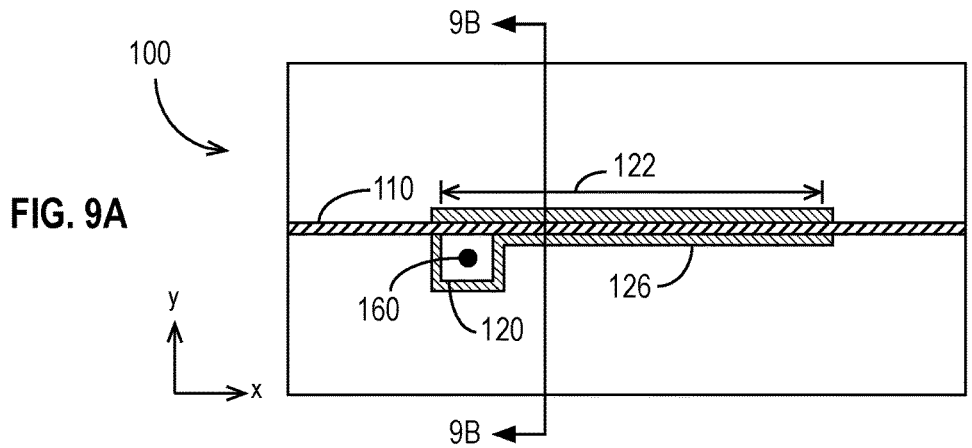
FIGS. 9A-9D illustrate a PCB with a PGS filter in accordance with some embodiments.

As explained previously, the frequencies attenuated by the resonator(s) 120 may be adjusted by modifying the dimensions of the resonator(s) 120. As just one example, FIG. 9A illustrates a PCB 100 with an L-shaped resonator 120 that has a compressed second dimension 124 (relative to the second dimension 124 of the L-shaped resonator 120 shown in FIGS. 6A and 7A) in accordance with some embodiments. In the example of FIG. 9A, the second dimension (labeled in FIG. 9C) is approximately 100 microns as opposed to 2-3 mm in FIGS. 6A-6C. It is to be understood that in some applications (e.g., PCBs), it is desirable for the second dimension 124 to be wider than the at least one signal trace 110 in order to account for manufacturing tolerances or to avoid a costly manufacturing process. In other applications (e.g., packages for integrated circuits or other highly precise applications), the second dimension 124 may be as narrow as the width of the at least one signal trace 110. As before, the resonator 120 is surrounded by a gap 126 filled with dielectric material. At least one signal trace 110 is situated over the resonator 120. As illustrated in FIG. 9A, at least a portion of the at least one signal trace 110 extends in the same direction as the first dimension 122. In the embodiment of FIG. 9A, the entirety of the at least one signal trace 110 that is situated over the resonator 120 extends in the same direction as the first dimension 122. A via 160 extends through the resonator 120 in a direction perpendicular to the x-y plane.

Figure 9B:
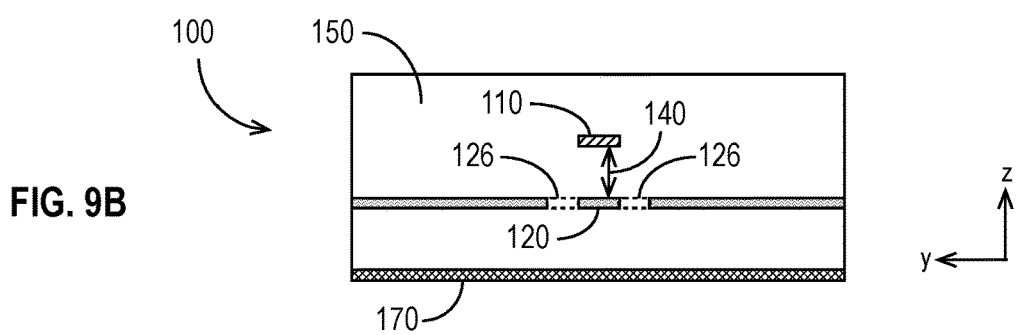

FIG. 9B illustrates the cross-section of the PCB 100 from FIG. 9A in the y-z plane at the 9B-9B line of FIG. 9A. Thus, the cross-section is in the y-z plane. As shown in FIG. 9B, the at least one signal trace 110 is spaced from the resonator 120 by a distance 140. The distance may be, for example, between approximately 30 μm and 100 μm. The at least one signal trace 110 is surrounded by, and separated from the resonator 120 by, a dielectric material 150, which may be an insulating material such as silicon oxide, silicon nitride, silicon oxynitride, glass-reinforced epoxy laminate material (FR-4), or other dielectric material.

Figure 9C:
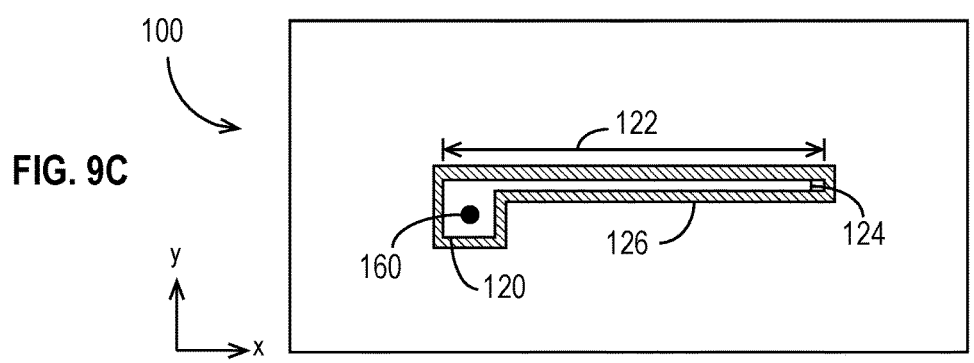

FIG. 9C shows the resonator 120 without the at least one signal trace 110 obscuring the resonator 120.

Figure 9D:
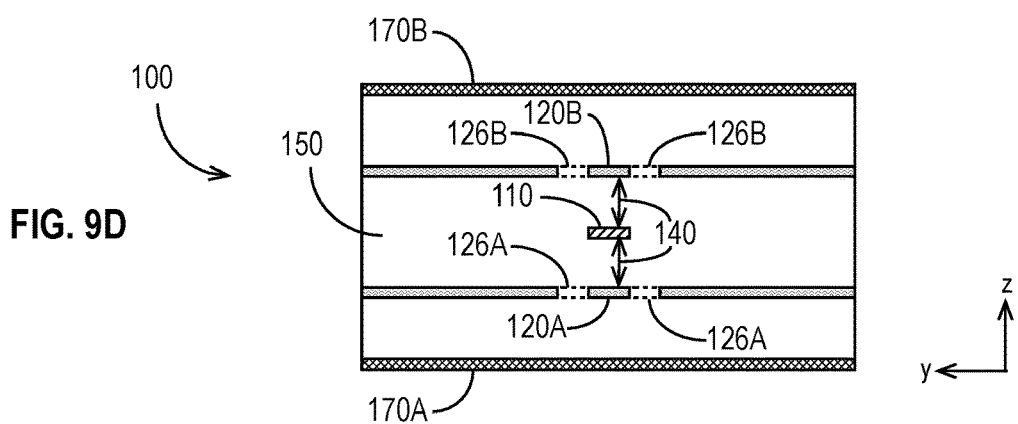

The PGS filter shown in FIG. 9B is unshielded. FIG. 9D illustrates the shielded version of the PGS filter shown in FIGS. 9A and 9C. To provide a shielded version, a substantially identical resonator structure is situated over the dielectric material 150. As shown in FIG. 9D, the PCB 100 includes a lower resonator 120A, bounded by a first gap 126A, and an upper resonator 120B, bounded by a second gap 126B, and two ground planes, 170A and 170B. The upper resonator 120B and second gap 126B are substantially identical in size, shape, and materials to the lower resonator 12A and first gap 126A. Thus, the upper resonator 120B and second gap 126B, if viewed in the x-y plane, would look identical to the resonator 120 and gap 126 shown in FIG. 9C.

Figure 10:
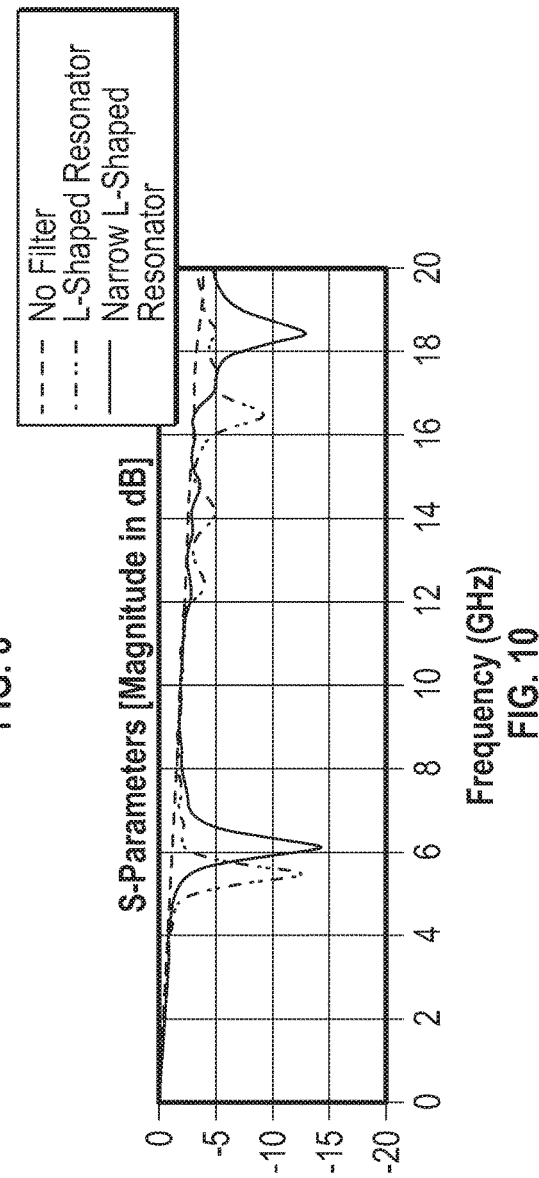
FIG. 10 illustrates how the S-parameters of the PGS filter shown in FIGS. 6A-6C differ from the S-parameters of the PGS filter shown in FIGS. 9A-9D.

FIG. 10 illustrates how the characteristics of the PGS filter differ between (a) the shielded L-shaped resonator 120 with at least one signal trace 110 that extends in the same direction as the first dimension 122 of the resonator 120, as illustrated in FIGS. 6A and 6C, and (b) the narrower shielded L-shaped resonator 120 with at least one signal trace 110 that also extends in the same direction as the first dimension 122 of the resonator 120, as illustrated in FIGS. 9A and 9D. Also shown for comparison purposes is the magnitude of the common-mode signal without any filter (dashed line). As shown by the dash-dot line in FIG. 10, the L-shaped resonator 120 shown in FIGS. 6A and 6C provides notches at approximately 5.5 GHz and 16.5 GHz. The notch at 5.5 GHz is approximately 12.5 dB, and the notch at 16.5 GHz is approximately 9 dB. The solid line of FIG. 10 illustrates that the narrower L-shaped resonator 120 shown in FIGS. 9A and 9D results in deeper notches at respectively higher frequencies. The narrower L-shaped resonator 120 provides a nearly 15 dB notch at a frequency slightly higher than 6 GHz and an approximately 13 dB notch at a frequency of roughly 18.5 GHz. Thus, FIG. 10 shows that both the locations and depths of the PGS filter notches may be tuned by adjusting the dimensions (e.g., the first dimension 122 and the second dimension 124) of the resonator(s) 120.

Figure 11A:
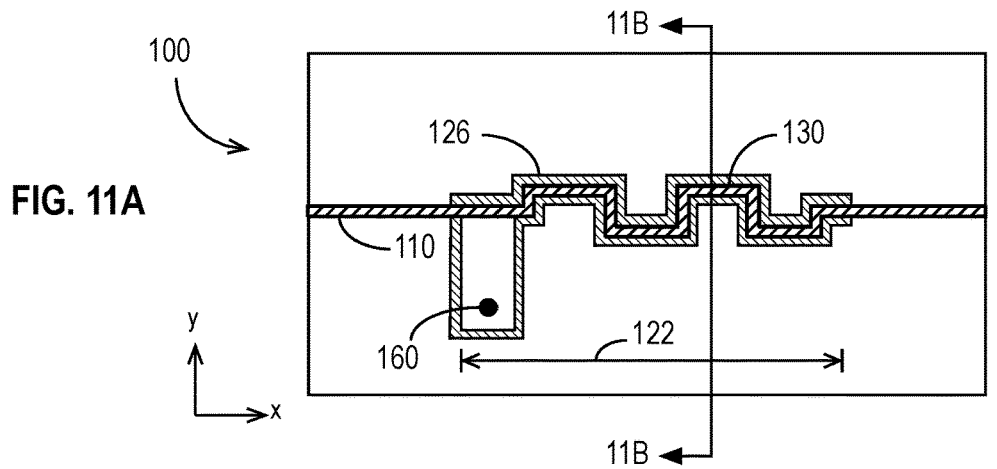
FIGS. 11A-11D illustrate a PCB with a PGS filter in accordance with some embodiments.

As illustrated by FIG. 8, increasing the length of the at least one signal trace 110 situated over the resonator 120 (or between the resonators 120A, 120B in a shielded configuration), such as by providing a meandering or zig-zag signal trace 110, increases the depths of the notches provided by the PGS filter. As illustrated by FIG. 10, reducing the length of the second dimension 124 of the L-shaped resonator 120 shifts the frequencies of the notches and increases the notch depths. The techniques of increasing the length of the at least one signal trace 110 situated over the resonator 120 (or between the resonators 120A, 120B) and tuning the frequencies of the notches of the PGS filter may be combined. As an example, FIG. 11A illustrates a PCB 100 having a zig-zag-shaped PGS in accordance with some embodiments. The PCB 100 is shown from the top, with the surface of the PCB 100 arbitrarily designated to be in the x-y plane as indicated in FIG. 11A. The PCB 100 includes a resonator 130 that has a zig-zag shape in the x-y plane of the PCB 100. The resonator 130 has a first dimension 122 and a second dimension 124 in the x-y plane of the PCB 100. The first dimension 122 and the second dimension 124 may be any suitable lengths that provide the desired filtering characteristics. Moreover, the zig-zag characteristics may include any suitable number of turns or cycles (e.g., it may have regular, irregular, periodic, or non-periodic characteristics). For applications in which it is desirable for the PGS to filter frequencies above 1 GHz, such as, for example, hard disk drives, suitable values for the first dimension 122 include, for example, lengths between approximately 4 mm and 9 mm. Suitable values for the second dimension 124 include, for example, lengths between approximately 100 microns and 3 mm.

The resonator 130 is surrounded by a gap 126. As explained above, the gap 126 is filled with dielectric material, which may be an insulating material such as silicon oxide, silicon nitride, silicon oxynitride, glass-reinforced epoxy laminate material (FR-4), or other dielectric material. At least one signal trace 110 is situated over the resonator 130. As illustrated in FIG. 6A, at least a portion of the at least one signal trace 110 extends in the same direction as the first dimension 122. In the embodiment of FIG. 11A, because the at least one signal trace 110 meanders to follow the shape of the resonator 130, only a portion of the at least one signal trace 110 that is situated over the resonator 130 extends in the same direction as the first dimension 122. A via 160 extends through the resonator 130 in a direction perpendicular to the x-y plane.

Figure 11B:
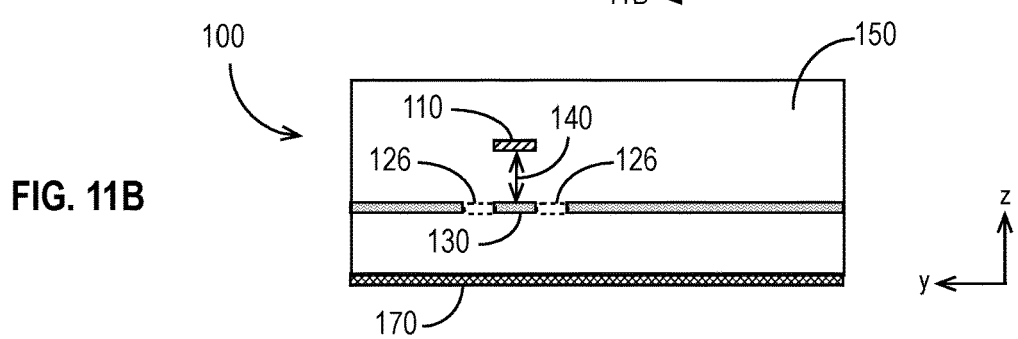

FIG. 11B shows a cross-section of the PCB 100 of FIG. 11A along the 11B-11B line shown in FIG. 11A. Thus, the cross-section is in the y-z plane. As shown in FIG. 11B, the at least one signal trace 110 is spaced from the resonator 130 by a distance 140. The distance may be, for example, between approximately 30 μm and 100 μm. The at least one signal trace 110 is surrounded by, and separated from the resonator 130 by, a dielectric material 150.

Figure 11C:
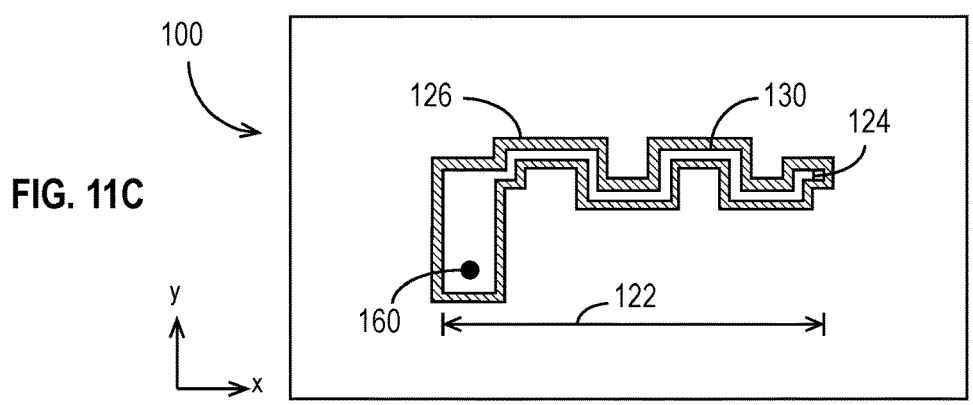

FIG. 11C shows the resonator 130 without the at least one signal trace 110 obscuring the resonator 130.

Figure 11D:
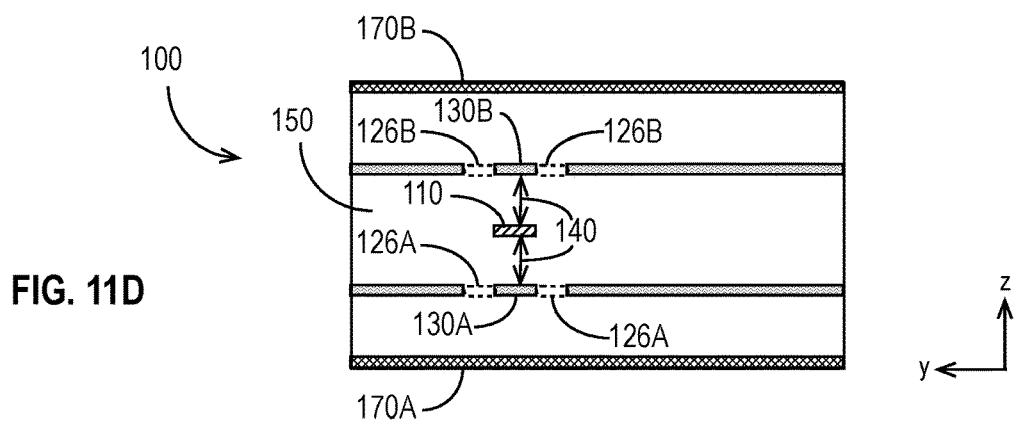

The PGS filter shown in FIG. 11B is unshielded. FIG. 11D illustrates the shielded version of the PGS filter shown in FIGS. 11A-11C. To provide a shielded version, a substantially identical resonator structure is situated over the dielectric material 150. As shown in FIG. 11D, the PCB 100 includes a lower resonator 130A, bounded by a first gap 126A, and an upper resonator 130B, bounded by a second gap 126B. The upper resonator 130B and second gap 126B are substantially identical in size, shape, and materials to the lower resonator 130A and the first gap 126A. Thus, the upper resonator 130B and second gap 126B, if viewed in the x-y plane, would look identical to the resonator 130 and gap 126 shown in FIG. 11C.

Figure 12:
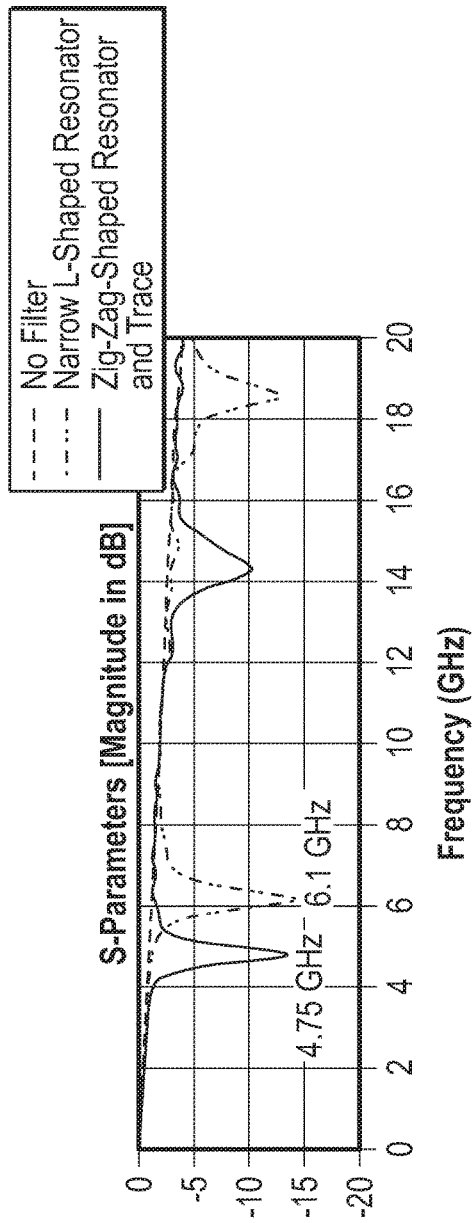
FIG. 12 illustrates how the S-parameters of the PGS filter shown in FIGS. 9A-9D differ from the S-parameters of the PGS filter shown in FIGS. 11A-11D.

FIG. 12 illustrates how the S-parameters of the PGS filter differ between (a) the narrow shielded L-shaped resonator 120 with at least one signal trace 110 that extends in the same direction as the first dimension 122 of the resonator 120, as illustrated in FIGS. 9A and 9D, and (b) the shielded zig-zag-shaped resonator 130 with a meandering at least one signal trace 110, as illustrated in FIGS. 11A and 11D. Also shown for comparison purposes is the magnitude of the common-mode signal without any filter (dashed line). As shown by the dash-dot line in FIG. 12, which is identical to the solid line shown in FIG. 10, the narrow L-shaped resonator 120 shown in FIGS. 9A and 9D provides a nearly 15 dB notch at approximately 6.1 GHz and an approximately 13 dB notch at a frequency of roughly 18.5 GHz. As shown by the solid line in FIG. 12, the zig-zag resonator 130 with the meandering at least one signal trace 110 provides a notch of approximately 13 dB at a frequency of approximately 4.75 GHz and an approximately 10 dB notch at a frequency of approximately 14.25 GHz. Thus, FIG. 12 shows that the locations and depths of the PGS filter notches may be tuned by using a zig-zag-shaped resonator 130 with dimensions selected to provide notches at the desired frequencies, and by adjusting the length of the portion of the at least one signal trace 110 situated over (or between) the resonator(s) 130 to provide notches of the desired depths.

Figure 13:
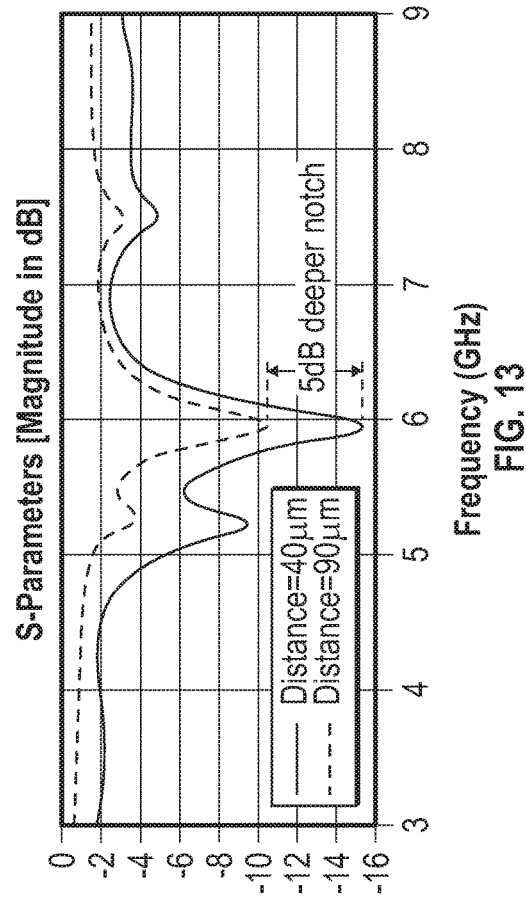
FIG. 13 illustrates the effect of reducing the distance between the signal trace and the resonator on the notch depth of the PGS filter.

In addition to the size and shape of the resonator(s) 120, 130 and the length of the portion of the at least one signal trace 110 situated over (between) the resonator(s) 120, 130, the distance 140 by which the resonator(s) 120, 130 are separated from the at least one signal trace 110 may be adjusted to tune the notch depth. FIG. 13 illustrates the effect of reducing the distance 140 between the at least one signal trace 110 and the resonator 120, 130 on the notch depth of the shielded PGS filter illustrated in FIG. 6C. The dashed line shows that the depth of the notch at approximately 6 GHz is slightly more than 10 dB when the distance 140 between the at least one signal trace 110 and the resonator 120, 130 is 90 μm. The solid line shows that the notch depth is approximately 5 dB greater, or roughly 15 dB, when the distance 140 between the at least one signal trace 110 and the resonator 120, 130 is 40 μm.

Thus, the PGS structures disclosed herein can be customized/tuned and/or used in combination to reduce and/or remove the common-mode signal at a particular frequency, at multiple selected frequencies, or within a particular frequency range. By appropriately selecting the dimensions (e.g., size and shape) of the resonator(s) 120, 130, the length of the at least one signal trace 110 situated over (between) the resonator(s) 120, 130, and/or the distance between the resonator(s) 120, 130 and the at least one signal trace 110, the locations in frequency and depths of notches provided by a single PGS may be controlled. Furthermore, a plurality of PGS filters may be positioned along the path that one or more signal traces 110 follow along the PCB 100 to provide additional or deeper notches in frequency. The PGS structures may be unshielded, or they may be shielded both above and below the traces 110. The anchor element locations may be customized and thus different in each PGS filter. By tailoring the individual patterned ground structures on the PCB, desired common-mode frequency or frequencies may be reduced and/or removed by selection of: the number of patterned ground structures, the locations of the anchor elements within the patterned ground structures, the sizes and shapes of the patterned ground structures, the length(s) of the portion of the signal trace(s) 110 situated over/between the patterned ground structures, the distance(s) between the signal trace(s) 110 situated over/between the patterned ground structures, and whether the patterned ground structures are shielded on both sides or a single side of the one or more signal traces 110.

The tailoring may be used to filter out multiple problem frequencies. For example, two PGS structures may be arranged in series to filter out the undesired frequencies for a pair of signal traces 110 (e.g., for differential signaling). One of the PGS structures may have a first length (e.g., value of the first dimension) while the other PGS structure has a second length (e.g., value of the first dimension) that is shorter than the first length. Due to the different lengths, the PGS structures may filter out different frequencies. In another example, the first PGS structure and the second PGS structure may have the same length (e.g., value of the first dimension), but the anchor elements (e.g., vias) are arranged in different locations. As such, the PGS structures filter different frequencies. In another example, the first and second PGS structures may be completely different in shape, size, and anchor element (via) location. It is to be understood that although placing two PGS structures in series has been discussed, additional PGS structures are envisioned. For example, four PGS structures may be arranged in series.

Additionally, the PGS structures may be utilized in multiple layer boards such as 6 layer and 8 layer boards such that multiple PGS structures may be disposed within the PCB 100 such that the traces on each level of the PCB 100 are filtered by the PGS structures.

By utilizing a patterned ground structure, common-mode current in PCBs can be reduced or eliminated. The size and shape of the resonator cavity in the patterned ground structure, the locations of the anchor elements, the length of the signal trace(s) situated over/between the resonator(s), and the distance by which the resonator(s) are separated from the signal trace(s) determine the frequencies of the common-mode current to be reduced or eliminated. Thus, knowing the desired frequency to eliminate, the patterned ground structure can be designed to suit a product's need.

In the foregoing description and in the accompanying drawings, specific terminology has been set forth to provide a thorough understanding of the disclosed embodiments. In some instances, the terminology or drawings may imply specific details that are not required to practice the invention.

Although this document explains aspects of certain embodiments in the context of data storage devices, using hard disk drives as examples of data storage devices, the disclosures herein are not limited to use in data storage device applications. Specifically, the various embodiments are applicable to other electronic devices with noise/interference mitigation needs. Furthermore, although certain embodiments are explained in the context of hard disk drives, and some of the drawings show a hard disk drive as an example data storage device, the various embodiments are applicable to other data storage devices such as solid state drives, solid state hybrid disk drives, optical disk drives, tape drives, and the like.

To avoid obscuring the present disclosure unnecessarily, well-known components (e.g., of a disk drive) are shown in block diagram form and/or are not discussed in detail or, in some cases, at all.

Unless otherwise specifically defined herein, all terms are to be given their broadest possible interpretation, including meanings implied from the specification and drawings and meanings understood by those skilled in the art and/or as defined in dictionaries, treatises, etc. As set forth explicitly herein, some terms may not comport with their ordinary or customary meanings.

As used in the specification and the appended claims, the singular forms "a," "an" and "the" do not exclude plural referents unless otherwise specified. The word "or" is to be interpreted as inclusive unless otherwise specified. Thus, the phrase "A or B" is to be interpreted as meaning all of the following: "both A and B," "A but not B," and "B but not A." Any use of "and/or" herein does not mean that the word "or" alone connotes exclusivity.

As used herein, phrases of the form "at least one of A, B, and C," "at least one of A, B, or C," "one or more of A, B, or C," and "one or more of A, B, and C" are interchangeable, and each encompasses all of the following meanings: "A only," "B only," "C only," "A and B but not C," "A and C but not B," "B and C but not A," and "all of A, B, and C."

To the extent that the terms "include(s)," "having," "has," "with," and variants thereof are used in the detailed description or the claims, such terms are intended to be inclusive in a manner similar to the term "comprising," i.e., meaning "including but not limited to." The terms "exemplary" and "embodiment" are used to express examples, not preferences or requirements.

The terms "over," "under," "between," and "on" are used herein refer to a relative position of one feature with respect to other features. For example, one feature disposed "over" or "under" another feature may be directly in contact with the other feature or may have intervening material. Moreover, one feature disposed "between" two features may be directly in contact with the two features or may have one or more intervening features or materials. In contrast, a first feature "on" a second feature is in contact with that second feature.

The drawings are not necessarily to scale, and the dimensions, shapes, and sizes of the features may differ substantially from how they are depicted in the drawings.

Although specific embodiments have been disclosed, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

What is claimed is:

1. A printed circuit board, comprising:
   a resonator in a first plane of the printed circuit board, the resonator having an L-shape in the first plane, the resonator having a first dimension in a first direction and a second dimension in a second direction in the first plane; and
   a signal trace in a second plane of the printed circuit board, the second plane being parallel to and over the first plane, wherein:
      a portion of the signal trace is situated over the resonator,
      the portion of the signal trace is separated by a distance from the resonator by a dielectric material,
      a first part of the portion of the signal trace extends in the first direction, and
      a second part of the portion of the signal trace extends in the second direction.

2. The printed circuit board recited in claim 1, wherein the signal trace is a differential signal trace.

3. The printed circuit board recited in claim 1, wherein the signal trace is a single-ended signal trace.

4. The printed circuit board recited in claim 1, wherein the distance is between approximately 30 µm and 100 µm.

5. The printed circuit board recited in claim 1, wherein the first dimension is between approximately 4 mm and 9 mm.

6. The printed circuit board recited in claim 1, wherein a length of the portion of the signal trace situated over the resonator is between approximately 4 mm and 9 mm.

7. The printed circuit board recited in claim 1, wherein the dielectric material is a first dielectric material, and wherein the resonator comprises:
   a first shield layer comprising a first conductive material;
   a second shield layer that is spaced from the first shield layer by a second dielectric material, the second shield layer comprising a second conductive material, wherein the second shield layer has a first outer portion and a first middle portion, the first middle portion being spaced from the first outer portion on all sides by the second dielectric material when viewed from a top view;
   a first anchor element extending between and coupled to the first shield layer and the second shield layer, wherein the first anchor element extends through the first middle portion of the second shield layer; and
   a second anchor element extending between and coupled to the first shield layer and the second shield layer, wherein the first anchor element extends through the first middle portion of the second shield layer.

8. A data storage device comprising the printed circuit board recited in claim 1.

9. A printed circuit board, comprising:
   a first resonator in a first plane of the printed circuit board, the first resonator having an L-shape in the first plane, the first resonator having a first dimension in a first direction and a second dimension in a second direction in the first plane;
   a signal trace in a second plane of the printed circuit board, the second plane being parallel to and over the first plane;
   a second resonator in a third plane of the printed circuit board, the second resonator being identical to the first resonator and positioned directly above or below the first resonator such that an orientation of the second resonator in the third plane is identical to an orientation of the first resonator in the first plane; and
   a via connecting the first resonator to the second resonator,
   wherein:
      a portion of the signal trace is situated over the first resonator,
      the portion of the signal trace is separated by a distance from the first resonator by a dielectric material,
      at least part of the portion of the signal trace extends in the first direction, and
      the second plane is situated between the first and third planes.

10. The printed circuit board recited in claim 9, wherein the part of the portion of the signal trace includes all of the portion of the signal trace situated over the resonator.

11. The printed circuit board recited in claim 9, wherein the part is a first part, and wherein a second part of the portion of the signal trace situated over the resonator extends in the second direction.

12. The printed circuit board recited in claim 9, wherein the dielectric material is a first dielectric material, and wherein each of the first and second resonators comprises:
   a first shield layer comprising a first conductive material;
   a second shield layer that is spaced from the first shield layer by a second dielectric material, the second shield layer comprising a second conductive material, wherein the second shield layer has a first outer portion and a first middle portion, the first middle portion being spaced from the first outer portion on all sides by the second dielectric material when viewed from a top view;

a first anchor element extending between and coupled to the first shield layer and the second shield layer, wherein the first anchor element extends through the first middle portion of the second shield layer; and a second anchor element extending between and coupled to the first shield layer and the second shield layer, wherein the first anchor element extends through the first middle portion of the second shield layer.

13. A data storage device comprising the printed circuit board recited in claim 9.

* * * * *